(12) United States Patent
Lin et al.

(10) Patent No.: US 11,710,634 B2
(45) Date of Patent: Jul. 25, 2023

(54) FABRICATION TECHNIQUE FOR FORMING ULTRA-HIGH DENSITY INTEGRATED CIRCUIT COMPONENTS

(71) Applicant: Synopsys, Inc., Mountain View, CA (US)

(72) Inventors: Xi-Wei Lin, Fremont, CA (US); Victor Moroz, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/372,265

(22) Filed: Jul. 9, 2021

(65) Prior Publication Data

US 2023/0154751 A1    May 18, 2023

Related U.S. Application Data

(60) Provisional application No. 63/053,504, filed on Jul. 17, 2020.

(51) Int. Cl.
*H01L 21/033* (2006.01)
*G03F 7/00* (2006.01)
(Continued)

(52) U.S. Cl.
CPC ...... *H01L 21/0337* (2013.01); *G03F 7/70466* (2013.01); *H01L 21/0338* (2013.01);
(Continued)

(58) Field of Classification Search
None
See application file for complete search history.

(56) References Cited

U.S. PATENT DOCUMENTS 9,397,049 B1     7/2016  Fan et al.
9,653,575 B1 *   5/2017  Basker ............. H01L 29/66666
                 (Continued)

FOREIGN PATENT DOCUMENTS

EP    3675158 A2     7/2020
TW    201635493 A    10/2016
              (Continued)

OTHER PUBLICATIONS

Ryckaert, J et al, "The Complementary FET (CFET) for CMOS scaling beyond N3", 2018 IEEE Symposium On VLSI Technology, IEEE, Jun. 18, 2018, pp. 141-142.
(Continued)

*Primary Examiner* — Roberts P Culbert
(74) *Attorney, Agent, or Firm* — Haynes Beffel & Wolfeld LLP; Andrew L. Dunlap

(57) ABSTRACT

A method for forming ultra-high density integrated circuitry, such as for a 6T SRAM, for example, is provided. The method involves applying double patterning litho-etch litho-etch (LELE) and using a spacer process to shrink the critical dimension of features. To improve process margins, the method implements a double-patterning technique by modifying the layout and splitting cross-coupling straps into two colors (e.g., each color corresponds to a mask-etch process). In addition, a spacer process is implemented to shrink feature size and increase the metal-to-metal spacing between the two cross-coupling straps, in order to improve process margin and electrical performance. This is achieved by depositing a spacer layer over an opening in a hardmask, followed by spacer etch back. The opening is thus shrunk by the amount of spacer thickness. The strap-to-strap spacing may then be increased by twice the amount of spacer thickness.

20 Claims, 10 Drawing Sheets

(51) Int. Cl.
  *H01L 21/3213* (2006.01)
  *H01L 21/308* (2006.01)
  *H10B 10/00* (2023.01)
(52) U.S. Cl.
  CPC .... *H01L 21/3086* (2013.01); *H01L 21/32139* (2013.01); *H10B 10/12* (2023.02)

(56) References Cited

U.S. PATENT DOCUMENTS

| | | | |
|---|---|---|---|
| 10,177,227 | B1 | 1/2019 | Yoshida et al. |
| 10,236,217 | B1 | 3/2019 | Ando et al. |
| 10,256,158 | B1 | 4/2019 | Frougier et al. |
| 10,269,929 | B2 | 4/2019 | Wostyn et al. |
| 2009/0014806 | A1 | 1/2009 | Ostermayr et al. |
| 2009/0081815 | A1* | 3/2009 | Yamashita ............. H01L 22/12 438/9 |
| 2010/0237406 | A1* | 9/2010 | Oyu ..................... H10B 12/053 257/329 |
| 2011/0003256 | A1 | 1/2011 | Van Der Heijden et al. |
| 2015/0333131 | A1 | 11/2015 | Mojumder et al. |
| 2016/0247722 | A1 | 8/2016 | Zhang et al. |
| 2018/0026042 | A1 | 1/2018 | Smith et al. |
| 2018/0374791 | A1 | 12/2018 | Smith et al. |
| 2019/0051523 | A1 | 2/2019 | Huang et al. |
| 2019/0109136 | A1 | 4/2019 | Ching et al. |
| 2019/0288004 | A1 | 9/2019 | Smith et al. |
| 2020/0035569 | A1 | 1/2020 | Frougier et al. |
| 2020/0105671 | A1 | 4/2020 | Lai et al. |
| 2020/0111670 | A1 | 4/2020 | Huang et al. |

FOREIGN PATENT DOCUMENTS

| | | |
|---|---|---|
| TW | 201913821 A | 4/2019 |
| TW | 201917893 A | 5/2019 |
| TW | 201937611 A | 9/2019 |
| TW | 201939747 A | 10/2019 |
| TW | 202018825 A | 5/2020 |
| TW | 202025448 A | 7/2020 |
| WO | 2020065916 A1 | 4/2020 |
| WO | 2020137660 A1 | 7/2020 |

OTHER PUBLICATIONS

PCT/US2021/041746—Partial Search Report dated Oct. 11, 2021, 17 pages.
PCT/US2021/041743—International Search Report and Written Opinion dated Oct. 4, 2021, 18 pages.
PCT/US2021/041749—International Search Report and Written Opinion dated Oct. 15, 2021, 19 pages.
PCT/US2021/041740—International Search Report and Written Opinion dated Sep. 29, 2021, 16 pages.
PCT/US2021/041746—International Search Report and Written Opinion dated Dec. 10, 2021, 24 pages.

* cited by examiner

FABRICATION TECHNIQUE FOR FORMING ULTRA-HIGH DENSITY INTEGRATED CIRCUIT COMPONENTS

RELATED APPLICATION

This application claims the benefit of U.S. Provisional Patent Application No. 63/053,504, titled "PATTERNING TECHNIQUE TO FORM ULTRA-HIGH DENSITY COMPLEMENTARY FIELD EFFECT TRANSISTOR (CFET) STATIC RANDOM ACCESS MEMORY (SRAM)," filed on 17 Jul. 2020, which application is incorporated herein by reference in its entirety.

BACKGROUND

Transistor stacking, such as the stacking implemented in a complementary field effect transistor (CFET), is a candidate for transistor density scaling and sustainment of Moore's Law for, possibly, the next 5-10 years. For example, transistor stacking may allow for the scaling in 3D of the CFET by stacking one transistor onto another, resulting in density doubling while maintaining feature size. CFETs may be used, for example, to form ultra-high density static random access memory (SRAM).

SUMMARY

Disclosed herein is a new lithographic patterning technique for improved semiconductor fabrication. More specifically, a method for forming ultra-high density integrated circuitry includes forming a first spacer on sidewalls of a first trench in a hardmask, which is on a dielectric layer, and patterning the dielectric layer using the hardmask and the first spacer as a mask to form a first channel having a cross-sectional area that is smaller than a cross-sectional area of the first trench. The method also includes forming a second spacer on sidewalls of a second trench in the hardmask, patterning the dielectric layer using the hardmask and the second spacer as a mask to form a second channel having a cross-sectional area that is smaller than a cross-sectional area of the second trench, removing the hardmask, the first spacer, and the second spacer, and depositing a metal into the first channel and the second channel in the dielectric layer. The dielectric layer may be disposed on a substrate that includes the ultra-high density integrated circuitry, which may be formed by a double patterning pitch splitting process that includes a first mask-exposure and a second mask-exposure. The ultra-high density integrated circuitry may include a first set of conductors formed by the first mask-exposure, and a second set of conductors formed by the second mask-exposure. The first channel in the dielectric layer electrically contacts the first set of conductors and the second channel in the dielectric layer electrically contacts the second set of conductors. In some implementations, the ultra-high density integrated circuitry comprises at least a portion of a 6T SRAM.

The first set of conductors and the second set of conductors may be substantially parallel to each other, and the first channel and the second channel may be disposed at a substantially acute angle with respect to the first set of conductors and the second set of conductors. The first channel and the second channel in the dielectric layer may be substantially parallel to each other and electrically insulated from each other. A closest distance between the first channel and the second channel may be less than 10 nanometers. The first spacer may comprise aluminum oxide and the hardmask may comprise amorphous silicon.

In some embodiments, a method for forming ultra-high density integrated circuitry, may include depositing a dielectric layer on a substrate, depositing a first hardmask on the dielectric layer, depositing a second hardmask on the first hardmask, patterning the second hardmask to form a first trench in the second hardmask, depositing a first spacer material on the second hardmask and in the first trench, partially etching the first spacer material so as to leave a first spacer on sidewalls of the first trench, patterning the first hardmask using the second hardmask and the first spacer as a mask to form a first trench extension having a cross-section that is smaller than a cross-section of the first trench, patterning the second hardmask to form a second trench in the second hardmask, depositing a second spacer material on the second hardmask and in the second trench, partially etching the second spacer material so as to leave a second spacer on sidewalls of the second trench, patterning the first hardmask using the second hardmask and the second spacer as a mask to form a second trench extension having a cross-section that is smaller than a cross-section of the second trench, removing the first spacer and the second spacer, removing the second hardmask, patterning the dielectric layer using the first hardmask, the first trench extension, and the second trench extension to form a first channel and a second channel in the dielectric layer, depositing metal on the dielectric layer and in the first channel and the second channel, and removing the metal on the dielectric layer and leaving the metal in the first channel and the second channel.

In some embodiments, the substrate may include the ultra-high density integrated circuitry, which is formed by a double patterning pitch splitting process that includes a first mask-exposure and a second mask-exposure, the ultra-high density integrated circuitry may include (i) a first set of conductors formed by the first mask-exposure and (ii) a second set of conductors formed by the second mask-exposure, and the first channel electrically may contact the first set of conductors and the second channel may electrically contact the second set of conductors. The ultra-high density integrated circuitry may comprise at least a portion of a 6T SRAM. The first set of conductors and the second set of conductors may be substantially parallel to each other, and the first channel and the second channel may be disposed at a substantially acute angle with respect to the first set of conductors and the second set of conductors. The first channel and the second channel in the dielectric layer may be substantially parallel to each other and electrically insulated from each other. The closest distance between the first channel and the second channel may be less than 10 nanometers. The first hardmask may comprise nitride, the second hardmask may comprise amorphous silicon or a carbon-based spin-on hardmask, and the first spacer material and the second spacer material may comprise aluminum oxide.

In some embodiments, a system may include a memory storing instructions for performing a patterning technique to form ultra-high density integrated circuitry, and a processor, coupled with the memory and to execute the instructions that, when executed, cause the processor to perform operations including: forming a first spacer on sidewalls of a first trench in a hardmask that is on a dielectric layer; patterning the dielectric layer using the hardmask and the first spacer as a mask to form a first channel having a cross-sectional area that is smaller than a cross-sectional area of the first trench; forming a second spacer on sidewalls of a second trench in the hardmask; patterning the dielectric layer using the hardmask and the second spacer as a mask to form a second channel having a cross-sectional area that is smaller than a cross-sectional area of the second trench; removing the hardmask, the first spacer, and the second spacer; and depositing a metal into the first channel and the second channel in the dielectric layer.

In some embodiments, the dielectric layer may be disposed on a substrate that includes the ultra-high density integrated circuitry, which is formed by a double patterning pitch splitting process that includes a first mask-exposure and a second mask-exposure. In this case, the ultra-high density integrated circuitry may include (i) a first set of conductors formed by the first mask-exposure and (ii) a second set of conductors formed by the second mask-exposure. The first channel in the dielectric layer may electrically contact the first set of conductors and the second channel in the dielectric layer may electrically contact the second set of conductors.

In some implementations, the ultra-high density integrated circuitry may comprise at least a portion of a 6T SRAM. The first set of conductors and the second set of conductors may be substantially parallel to each other, and the first channel and the second channel may be disposed at a substantially acute angle with respect to the first set of conductors and the second set of conductors. In some implementations, the first channel and the second channel in the dielectric layer may be substantially parallel to each other and electrically insulated from each other. A closest distance between the first channel and the second channel may be less than 10 nanometers.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

CFET architecture holds the potential to achieve SRAM density of more than a gigabit per square millimeter (Gbit/mm$^2$). However, because of tight pitch and spacing, as well as non-straight wiring, one of the most challenging processes for forming ultra-high density CFET SRAM involves lithographic patterning for fabricating cross-coupling straps between two inverters of the SRAM. Some single exposure or double patterning techniques generally have too little margin for error. Thus, there is a need to develop a robust lithography process to realize the high density potential of CFET SRAM. The technology disclosed provides a robust lithography process to realize the high-density potential of CFET SRAM.

Aspects of this disclosure are directed to a patterning technique for forming ultra-high density integrated circuitry, such as an ultra-high density complementary field effect transistor (CFET) static random-access memory (SRAM), for example. The patterning technique may be used for other configurations and types of integrated circuit structures.

A general technique for fabricating ultra-high density features in an integrated circuit involves multiple patterning (or multi-patterning) to enhance feature density. This technique is in contrast to ones involving a single lithographic exposure, which may not be able to provide sufficient resolution. Moreover, additional techniques, as discussed herein, may be used to fabricate features commensurate with the lithographic scale resulting from multiple patterning. For example, such additional techniques may be used to construct cross-coupled conductive straps (e.g., connectors) between integrated circuit features produced by multiple patterning. For a particular example, fabrication of a six-transistor (6T) SRAM is described below. In this example, the illustrated technique allows for an improved patterning process for a CFET SRAM by combining double patterning with a spacer process to shrink feature size and to maintain adequate metal-metal spacing for electrical isolation. The techniques may lead to wider lithographic process margins and greater yield for CFET fabrication processes, for example.

Figure 1:
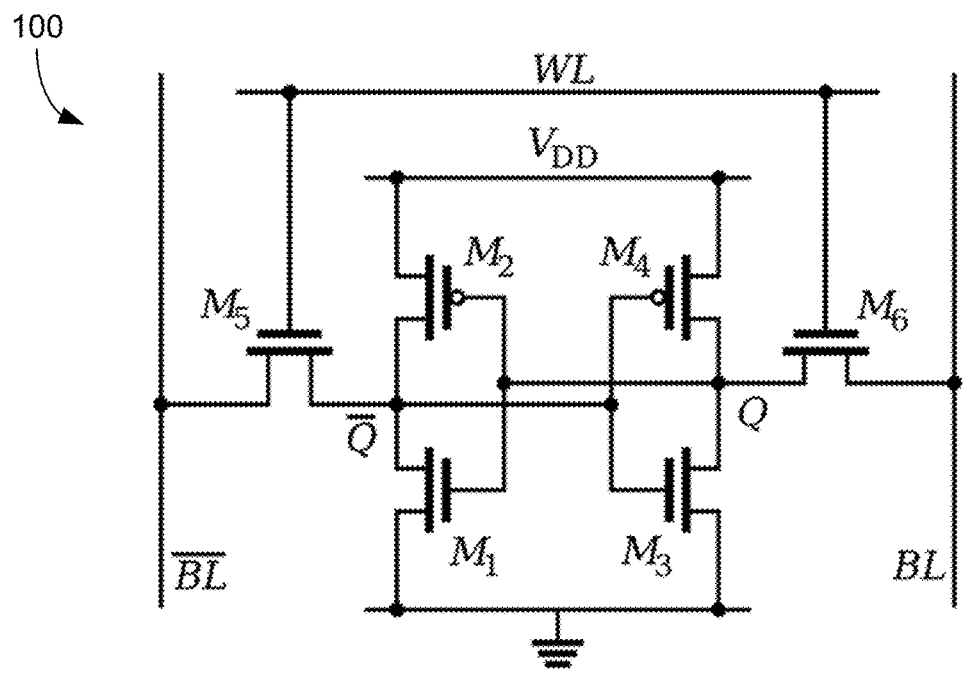
FIG. 1 is a schematic illustration of a six transistor (6T) static random-access memory (SRAM), according to some embodiments.

FIG. 1 is a schematic illustration of a six transistor (6T) static random-access memory (SRAM) 100, according to some embodiments. The 6T SRAM may be one of many interconnected among bit lines BL and BL-bar, and word lines WL, for example. The 6T SRAM includes transistors $M_1$-$M_6$, a node Q connected to gates of $M_1$ and $M_2$, and a node Q-bar connected to gates of $M_3$ and $M_4$. Nodes Q and Q-bar may correspond to cross-coupled straps, described below, electrically connecting the two inverter portions of SRAM 100.

Figure 2:
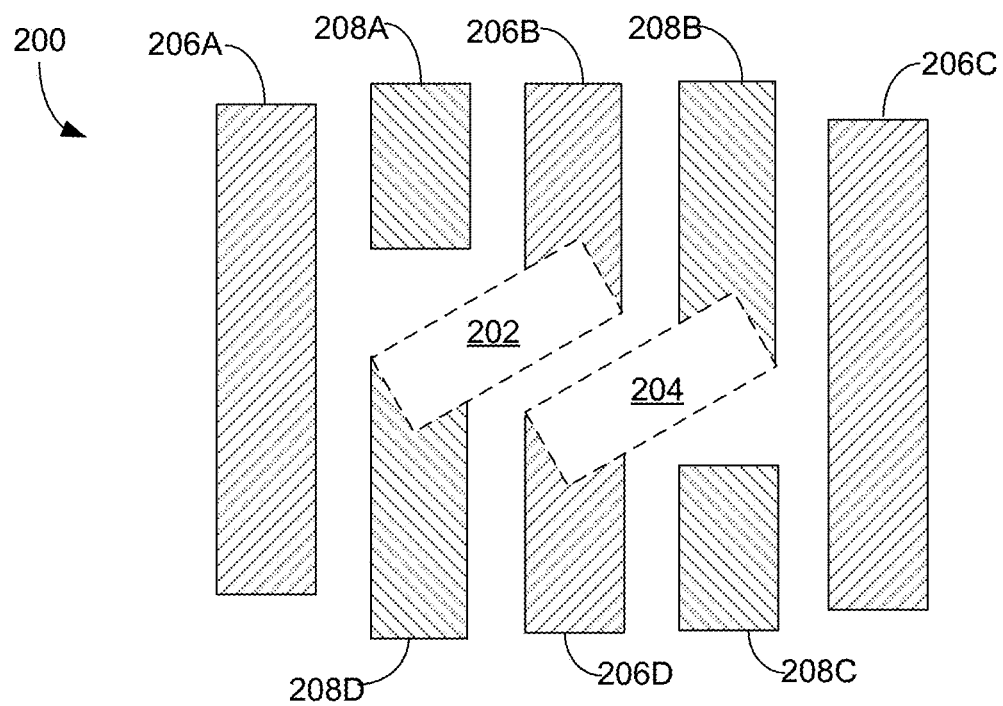
FIG. 2 illustrates two cross-coupling straps electrically connecting conductive features formed by a double-patterned pitch-splitting process, according to some embodiments.

FIG. 2 illustrates a top view of a portion 200 of a semiconductor circuit of a 6T SRAM, including a first cross-coupling strap 202 and a second cross-coupling strap 204, according to some embodiments. Portion 200 also includes conducting lines 206A-D and conducting lines 208A-D, all of which may have been formed by a double-patterned pitch-splitting process. For example, such a process may involve assigning adjacent lithographic features to two different masks. Thus, formation of conducting lines 206A-D may correspond to a first masking process and conducting lines 208A-D may correspond to a second masking process.

The 6T SRAM of FIG. 2 may be the same as or similar to 6T SRAM 100 of FIG. 1. In particular, first cross-coupling strap 202 electrically connects conducting line 206B, which may be the gate of $M_1$, to conducting line 208D, which may be the gate of $M_2$. Second cross-coupling strap 204 electrically connects conducting line 208B, which may be the gate of $M_3$, to conducting line 206D, which may be the gate of $M_4$. First cross-coupling strap 202 and second cross-coupling strap 204 may be at an acute angle (e.g., in a range between, but not including, perpendicular and parallel) with respect to conducting lines 206A-D and 208A-D. For example, cross-coupling strap 202 may be parallel with second cross-coupling strap 204 and both may be oriented at an angle in a range between 10 and 80 degrees with respect to conducting lines 206A-D and 208A-D. Features at such angled orientations may generally be relatively difficult to form in a lithographic CFET process. For example, a tilted connection (strap) is relatively difficult to form due to alignment and optics of lithographic exposures and etching.

FIGS. 3-6 illustrate a sequence of a lithographic process for forming two cross-coupling straps, according to some embodiments. In some embodiments, this process, involving single lithography, may lead to a spacing between the two cross-coupling straps that is too small to be resolved. In other embodiments, this process, involving separate lithography with double patterning, may lead to edge placement errors of features that may result in dangerous narrowing of metal-to-metal spacing (e.g., electrical shorting). In still other embodiments, this process may allow for resolving the two cross-coupling straps, but the patterning quality may strongly depend on feature size, spacing, and rotation angle. For example, patterns cannot be resolved unless the exposure and resist etch can be resolved.

Figure 3A:
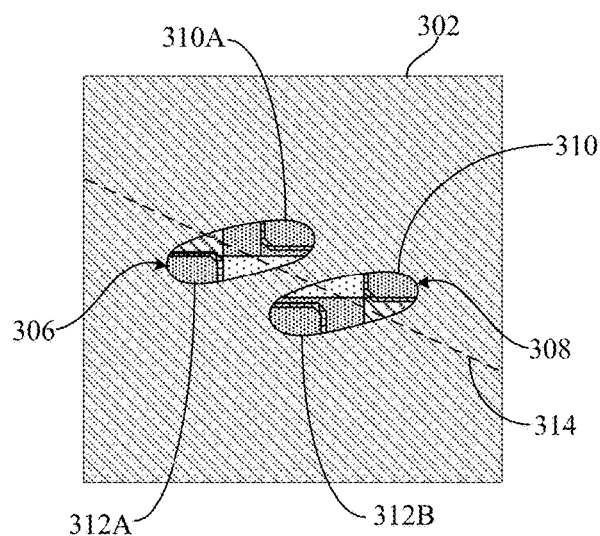
FIGS. 3A, 3B, 4A, 4B, 5A, 5B, 6A, and 6B illustrate a portion of a sequence of a lithographic process for forming two cross-coupling straps, according to some embodiments.

FIG. 3A is a top view of a portion of semiconductor substrate that includes various features and circuitry. In particular, a hardmask 302, such as amorphous silicon, overlays a dielectric material 304. Generally, a hardmask is a material used as an etch mask in semiconductor processing. The hardmask may be used as an etch mask in place of a polymer or other resist material. The hardmask may be used in place of polymers, which tend to be etched easily by reactive gases so that a pattern defined using a polymer-based mask may degrade quickly during plasma etching. A first trench 306 and a second trench 308 are disposed in hardmask 302 and dielectric material 304. In some embodiments, first trench 306 and second trench 308 may have been formed by patterning of dielectric material 304 by hardmask 302. Partially exposed at the bottom of first trench 306 are conducting lines 310A and 312A which, using the example illustrated in FIG. 2, may correspond to conducting lines 206B and 208D, respectively. Partially exposed at the bottom of second trench 308 are conducting lines 310B and 312B which, again using the example illustrated in FIG. 2, may correspond to conducting lines 208B and 206D, respectively. Thus, looking ahead, filling at least a bottom portion of these trenches with a metal or other conductive material may produce cross-coupling straps, such as first cross-coupling strap 202 and second cross-coupling strap 204, for example.

Figure 3B:
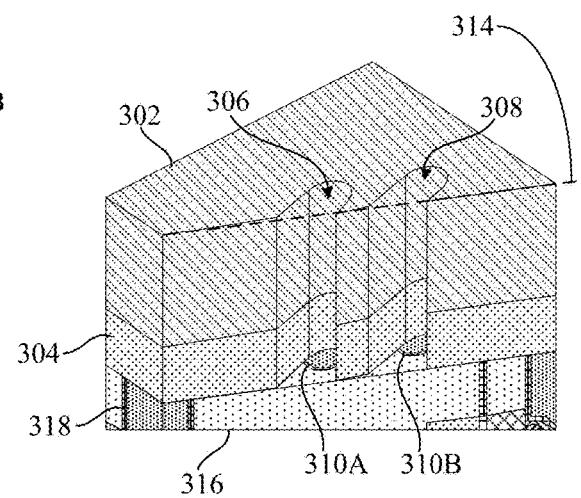

Using a cut-line 314 in the top view of FIG. 3A, FIG. 3B illustrates a perspective view of the portion of semiconductor substrate that includes various features and circuitry. In this view, a substrate material 316, which may comprise an electrically insulative material, is visible. A cross-section of another conductive line 318 is also visible.

Figure 4A:
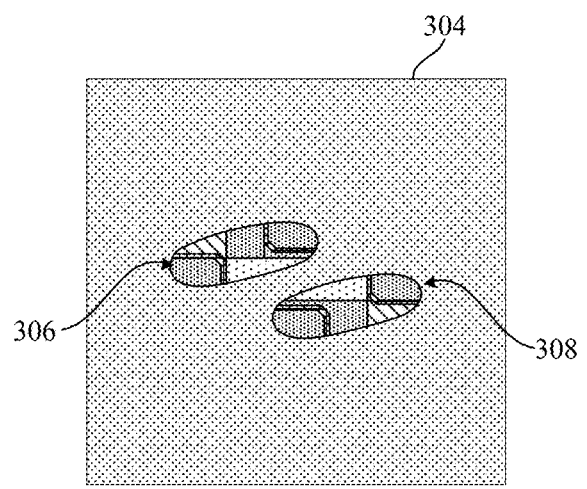
Figure 4B:
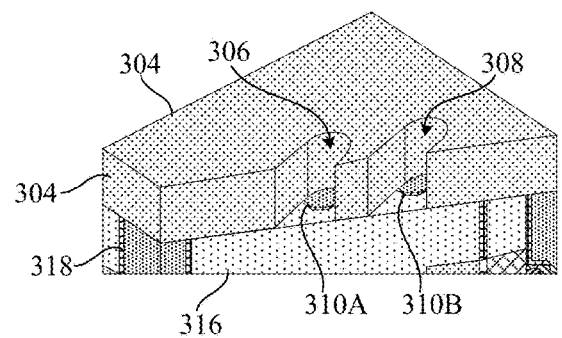

FIG. 4A is a top view and FIG. 4B is a perspective view of the portion of the semiconductor substrate illustrated in FIGS. 3A and 3B after hardmask 302 has been removed (e.g., by chemical etching or polishing).

Figure 5A:
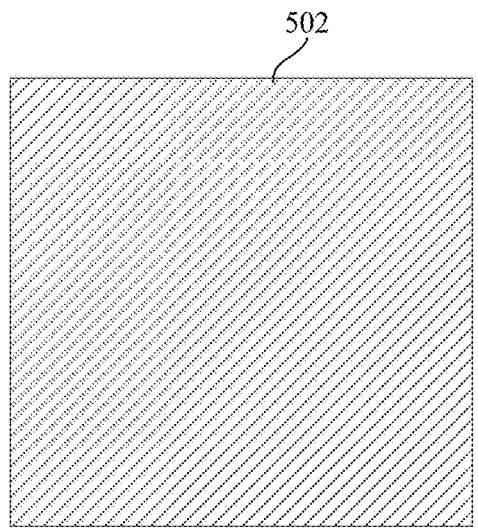
Figure 5B:
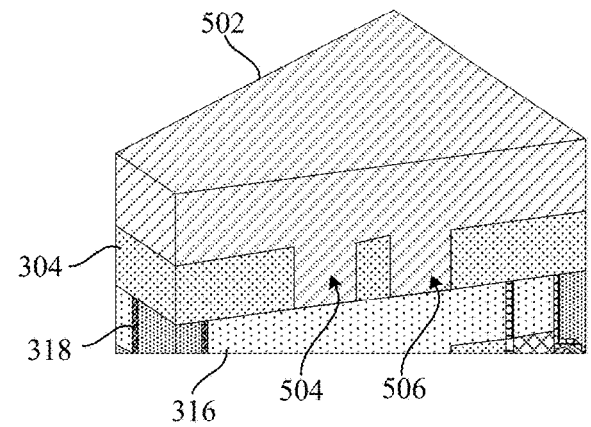

FIG. 5A is a top view and FIG. 5B is a perspective view of the portion of the semiconductor substrate illustrated in FIGS. 4A and 4B after deposition of a metal 502 (e.g., by vapor deposition). Portions 504 and 506 of metal 502 extend into first trench 306 and second trench 308.

Figure 6A:
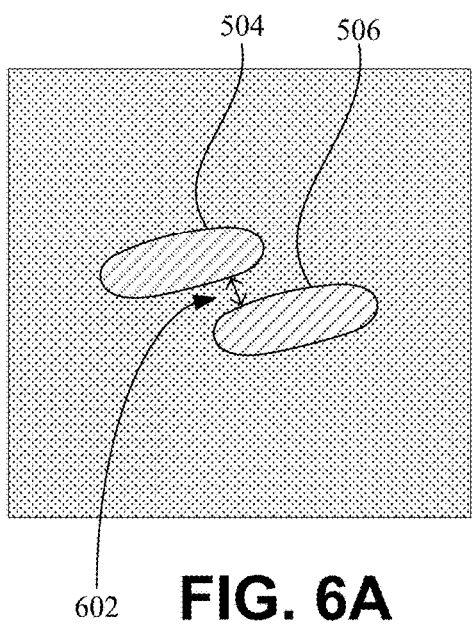
Figure 6B:
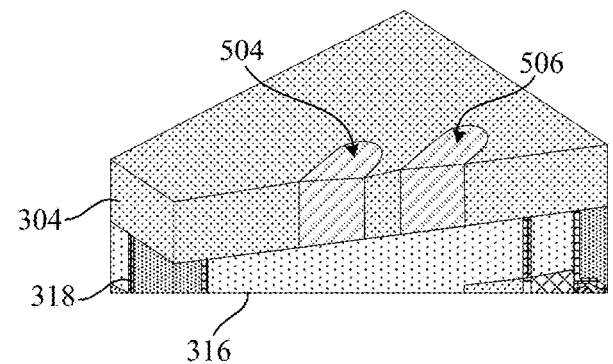

FIG. 6A is a top view and FIG. 6B is a perspective view of the portion of the semiconductor substrate illustrated in FIGS. 5A and 5B after partial removal of metal 502 (e.g., by chemical-mechanical polishing). In particular, portions 504 and 506 of metal 502 remain in first trench 306 and second trench 308. Accordingly, portion 504 is a first cross-coupling strap, such as first cross-coupling strap 202, that electrically connects conducting lines 310A and 312A. Portion 506 is a second cross-coupling strap, such as second cross-coupling strap 204, that electrically connects conducting lines 310B and 312B.

As mentioned above, a process such as that illustrated in FIGS. 3-6 may lead to a spacing 602 between two cross-coupling straps 504 and 506 that is too small to be resolved, may lead to edge placement errors, or may lead to patterning quality that is strongly dependent on feature size, spacing, and rotation angle of the cross-coupling straps. Thus, another process is described below.

FIGS. 7-11 illustrate a sequence of a lithographic process for forming two cross-coupling straps, according to embodiments. In particular, FIGS. 7-10 illustrate a method for forming ultra-high density integrated circuitry, such as for a 6T SRAM, for example. This method is different from the process illustrated in FIGS. 3-6 and described above. This method involves applying double patterning litho-etch litho-etch (LELE) and using a spacer process to shrink the critical dimension (CD) of each strap. Accordingly, this method provides a solution to shortcomings, as mentioned above, of the previous process of FIGS. 3-6. As explained in detail below, to improve the process margins discussed above with respect to FIGS. 3-6, this method implements a double-patterning technique by modifying the layout and splitting the process of forming the cross-coupling straps into two colors (e.g., each color corresponds to a mask-etch process). In addition, a spacer process is implemented to shrink feature size and increase the metal-to-metal spacing between the two cross-coupling straps, in order to improve process margin and electrical performance. This is achieved by depositing a spacer layer over an opening in a hardmask, followed by spacer etch back. The opening is thus shrunk by the amount of spacer thickness. The strap-to-strap spacing may then be increased by twice the amount of spacer thickness, as described below.

FIGS. 7-10 include perspective views of a portion of a semiconductor substrate that includes various features and circuitry and, with respect to cut-line 700, FIG. 11 includes top views corresponding to the perspective views of FIGS. 7-10. At least a portion of the circuitry is formed by a double patterning pitch splitting process that includes a first mask-exposure and a second mask-exposure (not illustrated), for example.

Figure 7A:
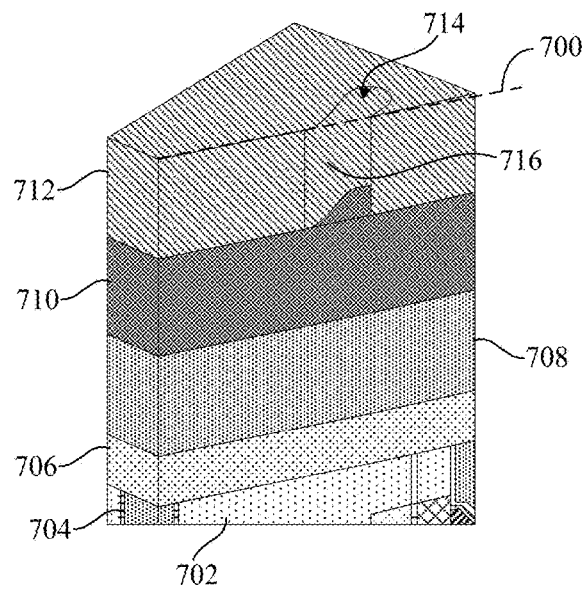
FIGS. 7A, 7B, 7C, 7D, 8A, 8B, 8C, 8D, 9A, 9B, 9C, 9D, 10A, 10B, 10C, 10D, 11A, 11B, 11C, 11D, 11E, and 11F illustrate a sequence of a lithographic process for forming two cross-coupling straps, according to other embodiments.
Figure 11A:
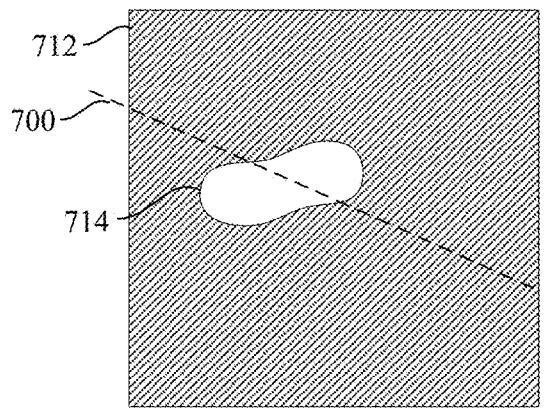

FIG. 7A is a perspective view and FIG. 11A is a top view of the portion of the semiconductor substrate and various features, including a substrate material 702, which may comprise an electrically insulative material, conductive lines 704 (a portion of one conductive line is illustrated), a dielectric material 706, such as a low-k dielectric, a first hardmask 708, such as a nitride layer, a second hardmask 710, such as a carbon-based spin-on hard mask (CSOH), and a third hardmask 712, such as an amorphous silicon layer. A first trench 714 with sidewalls 716 is disposed in third hardmask 712. Second hardmask 710 is partially exposed at the bottom of first trench 714. Conductive lines 704 may comprise at least a portion of the circuitry formed by a double patterning pitch splitting process, as described above.

Figure 7B:
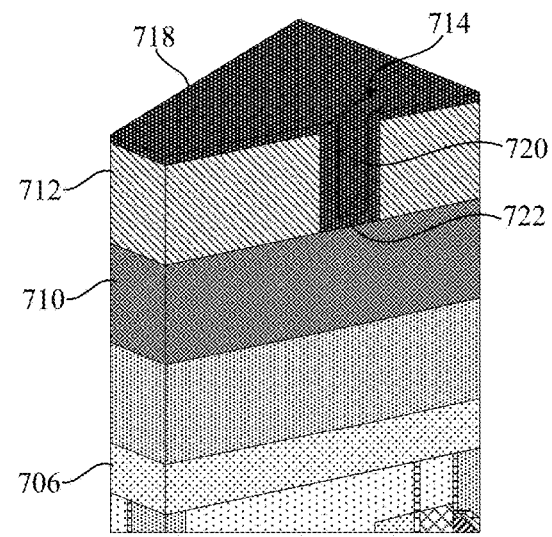

FIG. 7B is a perspective view of the portion of the semiconductor substrate illustrated in FIG. 7A after placing (e.g., by a vapor deposition process) a first spacer material 718 on third hardmask 712 and in first trench 714. A portion 720 of first spacer material 718 covers sidewalls 716 and a portion 722 of first spacer material 718 covers the portion of second hardmask 710 that was exposed at the bottom of first trench 714. In some embodiments, first spacer material 718 may comprise aluminum oxide, silicon oxide, silicon nitride, and silicon oxynitride, for example.

Figure 7C:
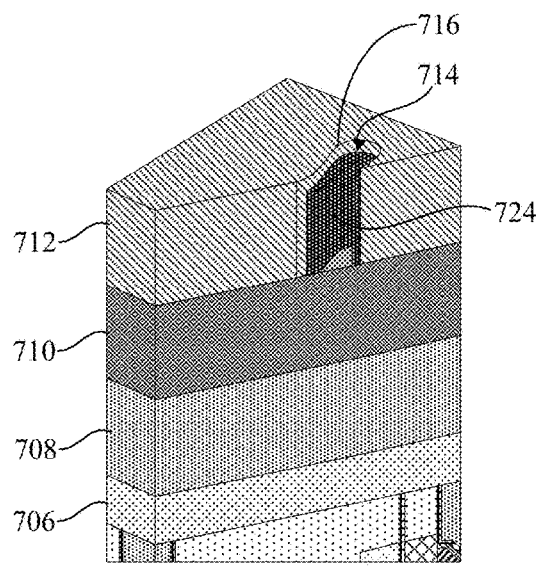
Figure 11B:
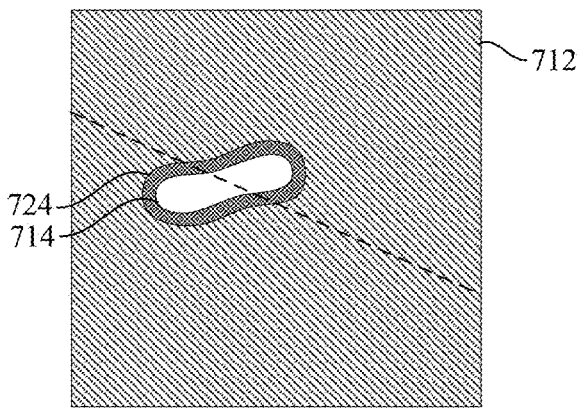

FIG. 7C is a perspective view, and FIG. 11B is a top view, of the portion of the semiconductor substrate illustrated in FIG. 7B after partially etching, by an etch-back process for example, first spacer material 718 so as to leave a first spacer 724 on sidewalls 716 of first trench 714. The presence of first spacer 724 on sidewalls 716 reduces the cross-sectional open area of first trench 714 so that the area of second hardmask 710 exposed by first trench 714 is also reduced.

Figure 7D:
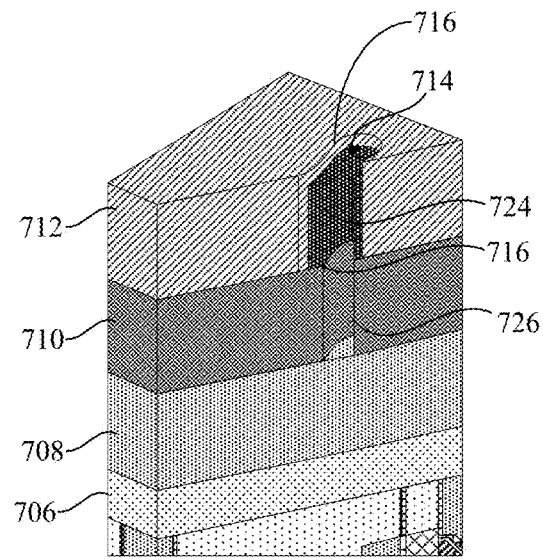

FIG. 7D is a perspective view of the portion of the semiconductor substrate illustrated in FIG. 7C after a patterning process is performed on the second hardmask 710 using third hardmask 712 and first spacer 724 as a mask to form a first trench extension 726. Because of the reduced cross-sectional open area of first trench 714, due to the presence of first spacer 724 on sidewalls 716, the cross-sectional area of first trench extension 726 is smaller than the cross-section area of first trench 714.

Figure 8A:
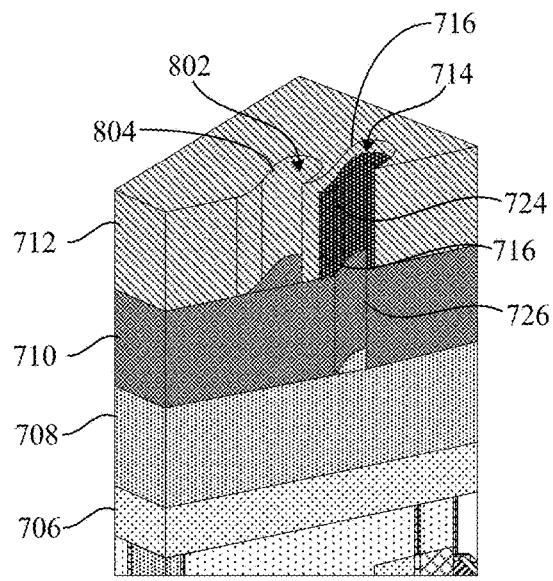
Figure 11C:
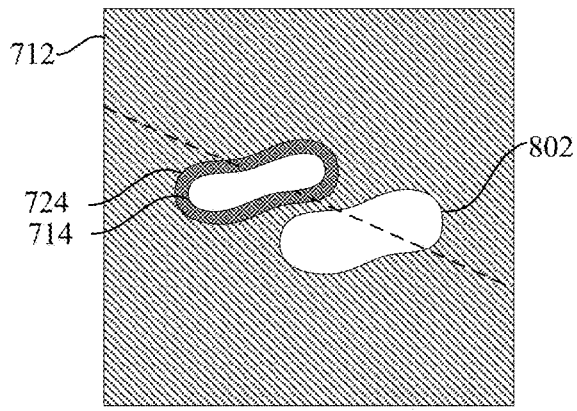

FIG. 8A is a perspective view, and FIG. 11C is a top view, of the portion of the semiconductor substrate illustrated in FIG. 7D after patterning third hardmask 712 to form a second trench 802 having sidewalls 804 in the third hardmask. In some embodiments, second trench 802 may be substantially parallel to first trench 714.

Figure 8B:
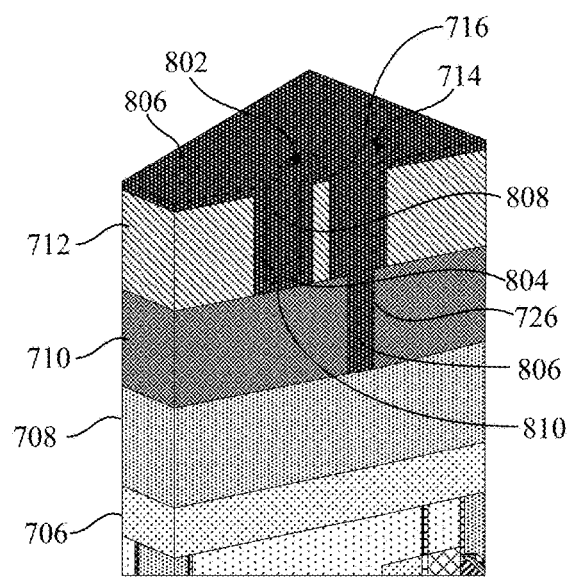

FIG. 8B is a perspective view of the portion of the semiconductor substrate illustrated in FIG. 8A after placing (e.g., by a chemical vapor deposition or atomic layer deposition process) a second spacer material 806 on third hardmask 712 and in first trench 714 and second trench 802. A portion 808 of second spacer material 806 covers sidewalls 804 and a portion 810 of second spacer material 806 covers the portion of second hardmask 710 that was exposed at the bottom of second trench 802. In some embodiments, second spacer material 806 may comprise aluminum oxide, silicon oxide, silicon nitride, or silicon oxynitride, for example. While covering sidewalls 804 of second trench 802, second spacer material 806 may also at least partially fill first trench 714 and first trench extension 726.

Figure 8C:
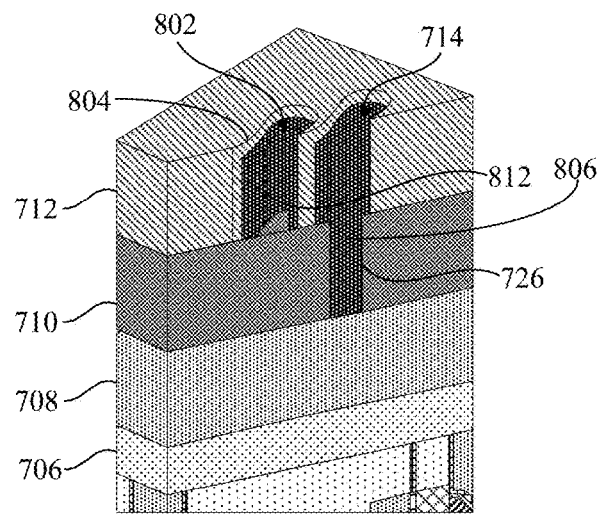

FIG. 8C is a perspective view of the portion of the semiconductor substrate illustrated in FIG. 8B after partially etching, by an anisotropic etch such as a reactive ion etch back process for example, second spacer material 806 so as to leave a second spacer 812 on sidewalls 804 of second trench 802. The presence of second spacer 812 on sidewalls 804 reduces the cross-sectional open area of second trench 802 so that the area of second hardmask 710 exposed by second trench 802 is also reduced.

Figure 8D:
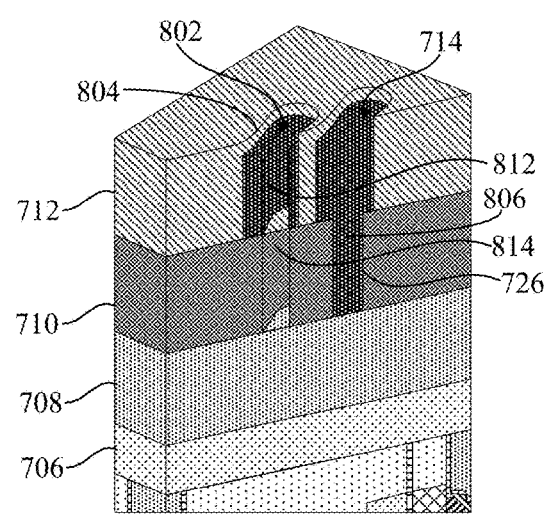
Figure 11D:
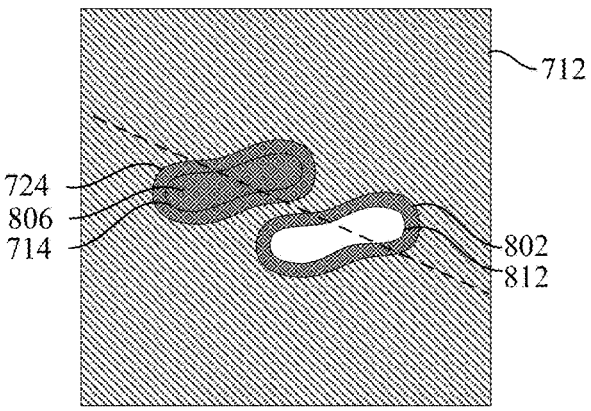

FIG. 8D is a perspective view, and FIG. 11D is a top view, of the portion of the semiconductor substrate illustrated in FIG. 8C after a patterning process is performed on the second hardmask 710 using third hardmask 712 and second spacer 812 as a mask to form a second trench extension 814. Because of the reduced cross-sectional open area of second trench 802, due to the presence of second spacer 812 on sidewalls 804, the cross-sectional area of second trench extension 814 is smaller than the cross-section area of second trench 802.

Figure 9A:
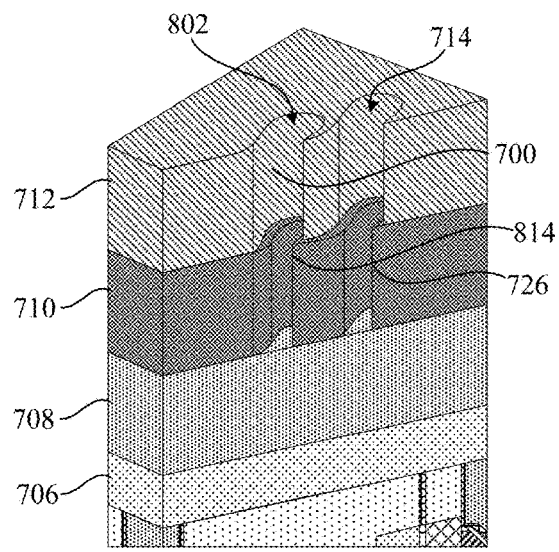

FIG. 9A is a perspective view of the portion of the semiconductor substrate illustrated in FIG. 8D after removing (e.g., by wet chemical etching or isotropic plasma etch) first spacer 724 and second spacer material 806 from first trench 714 and first trench extension 726 and removing second spacer 812 from second trench 802.

Figure 9B:
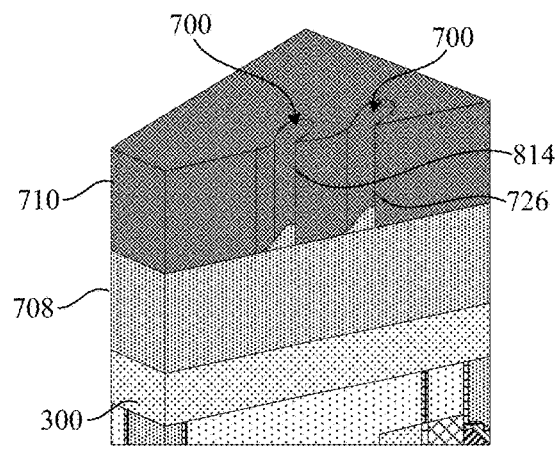

FIG. 9B is a perspective view of the portion of the semiconductor substrate illustrated in FIG. 9A after removing (e.g., by wet or dry chemical etching, isotropic plasma etching, or chemical-mechanical polishing) third hardmask 712.

Figure 9C:
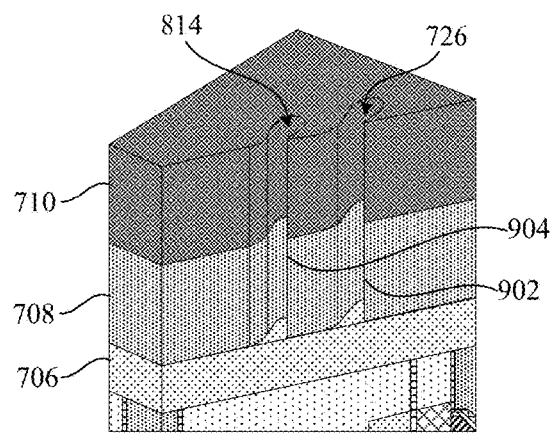

FIG. 9C is a perspective view of the portion of the semiconductor substrate illustrated in FIG. 9B after a patterning process is performed on the first hardmask 708 using second hardmask 710 as a mask to form a third trench extension 902 of first trench extension 726 and a fourth trench extension 904 of second trench extension 814.

Figure 9D:
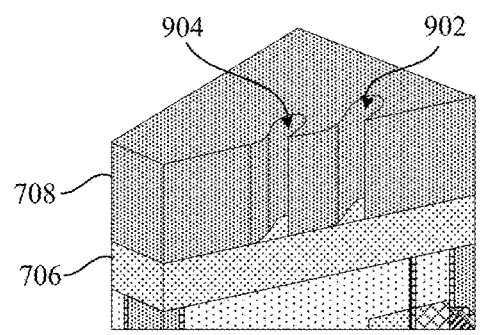

FIG. 9D is a perspective view of the portion of the semiconductor substrate illustrated in FIG. 9C after removing (e.g., by wet or dry chemical etching, isotropic plasma etch, or chemical-mechanical polishing) second hardmask 710.

Figure 10A:
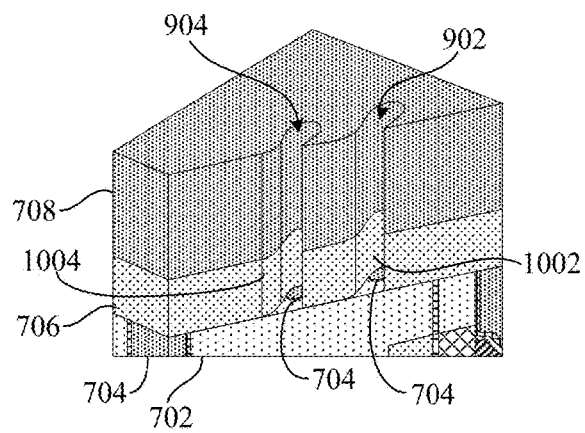
Figure 11E:
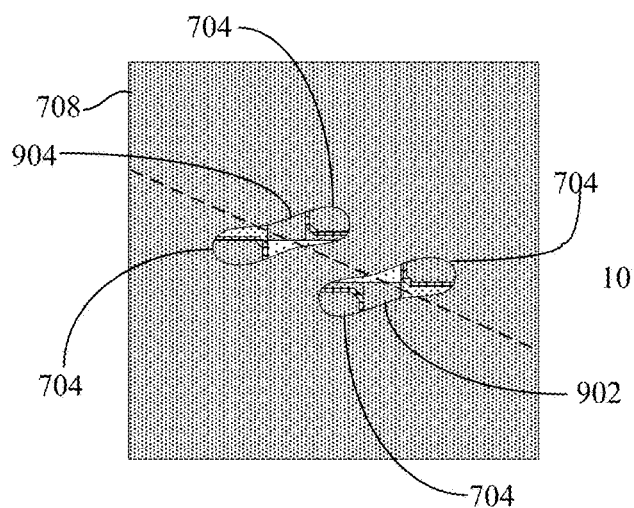

FIG. 10A is a perspective view, and FIG. 11E is a top view, of the portion of the semiconductor substrate illustrated in FIG. 9D after a patterning process is performed on dielectric material 706 using first hardmask 708 as a mask to form a fifth trench extension 1002 of third trench extension 902 and a sixth trench extension 1004 of fourth trench extension 904. Fifth trench extension 1002 and sixth trench extension 1004 expose substrate material 702. Moreover, fifth trench extension 1002 exposes a portion of one of conductive lines 704 and sixth trench extension 1004 exposes a portion of another one of conductive lines 704.

Figure 10B:
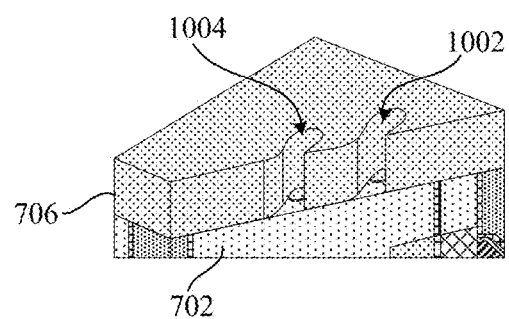

FIG. 10B is a perspective view of the portion of the semiconductor substrate illustrated in FIG. 10A after removing (e.g., by wet or dry chemical etching, isotropic plasma etching, or chemical-mechanical polishing) first hardmask 708.

Figure 10C:
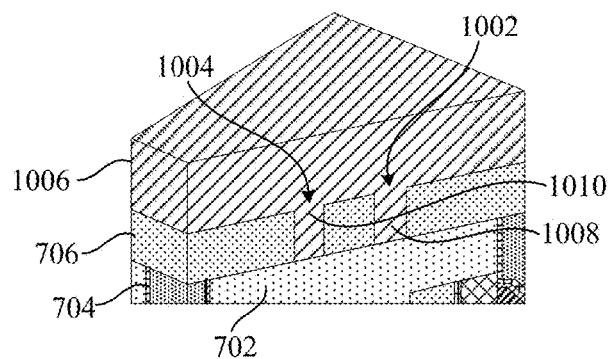

FIG. 10C is a perspective view of the portion of the semiconductor substrate illustrated in FIG. 10B after placing (e.g., by a physical or chemical vapor deposition process, atomic layer deposition, or electro-chemical plating deposition) a conductive material (e.g., metal) 1006 on dielectric material 706 and in fifth trench extension 1002 and sixth trench extension 1004. A portion 1008 of conductive material 1006 extends into and at least partially fills fifth trench extension 1002. A portion 1010 of conductive material 1006 extends into and at least partially fills sixth trench extension 1004.

Figure 10D:
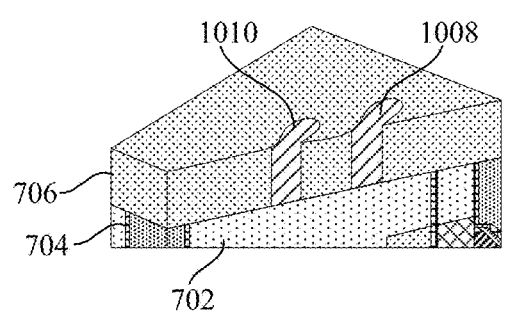
Figure 11F:
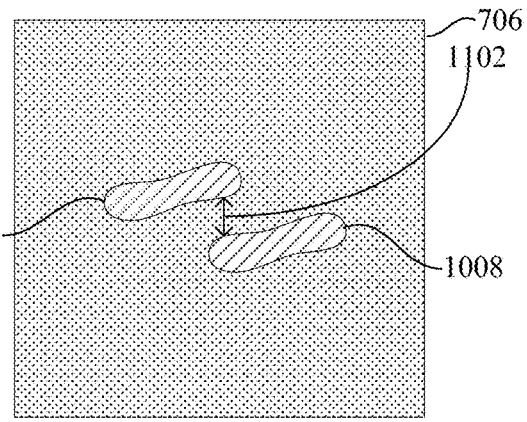

FIG. 10D is a perspective view, and FIG. 11F is a top view, of the portion of the semiconductor substrate illustrated in FIG. 10D after removing (e.g., by chemical etching or chemical-mechanical polishing) conductive material 1006 to expose dielectric material 706, while leaving portion 1008 of conductive material 1006 in fifth trench extension 1002 and portion 1010 of conductive material 1006 in sixth trench extension 1004. Portions 1008 and 1010 may respectively comprise two cross-coupling straps, such as 202 and 204 illustrated in FIG. 2, that interconnect various portions of conductive lines 704. Also, portions 1008 and 1010 may be substantially parallel to each other and may be disposed at a substantially acute angle (e.g., between 10 and 80 degrees) with respect to conductive lines 704. In some implementations, a closest distance 1102 between portions 1008 and 1010 may be less than about 10 nanometers.

Figure 12:
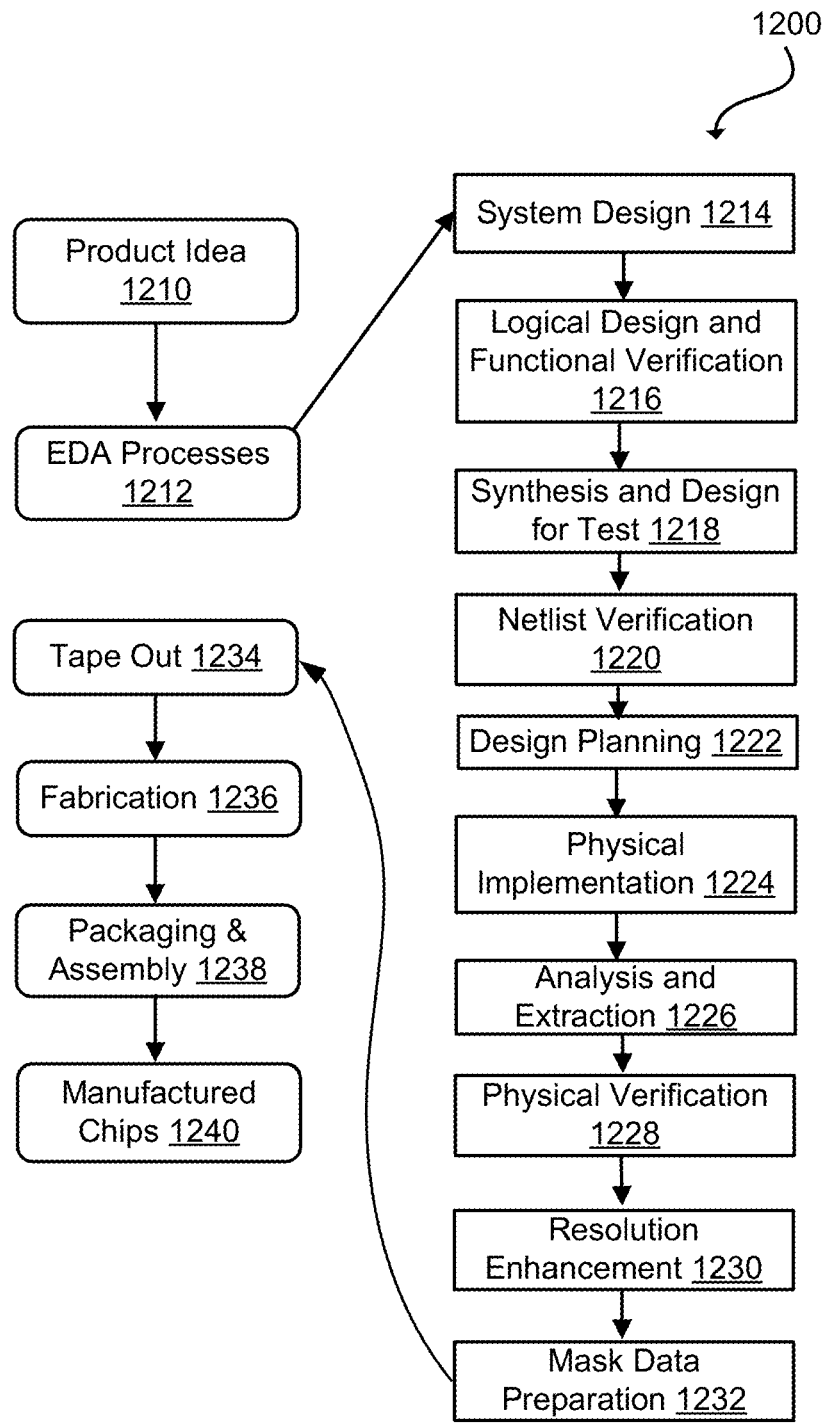
FIG. 12 depicts a flowchart of various processes used during the design and manufacture of an integrated circuit in accordance with some embodiments of the present disclosure.

FIG. 12 illustrates an example set of processes 1200 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1210 with information supplied by a designer, information which is transformed to create an article of manufacture that uses a set of EDA processes 1212. When the design is finalized, the design is taped-out 1234, which is when artwork (e.g., geometric patterns) for the integrated circuit is sent to a fabrication facility to manufacture the mask set, which is then used to manufacture the integrated circuit. After tape-out, a semiconductor die is fabricated 1236 and packaging and assembly processes 1238 are performed to produce the finished integrated circuit 1240. This fabrication state 1236 can include the fabrication techniques for forming the ultra-high density integrated circuit components, as described above.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 4. The processes described by be enabled by EDA products (or tools).

During system design 1214, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1216, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1218, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1220, the netlist is checked for compliance with timing constraints and for correspondence with the HDL code. During design planning 1222, an overall floor plan for the integrated circuit is constructed and analyzed for timing and top-level routing.

During layout or physical implementation 1224, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1226, the circuit function is verified at the layout level, which permits refinement of the layout design. During physical verification 1228, the layout design is checked to ensure that manufacturing constraints are correct, such as DRC constraints, electrical constraints, lithographic constraints, and that circuitry function matches the HDL design specification. During resolution enhancement 1230, the geometry of the layout is transformed to improve how the circuit design is manufactured.

During tape-out, data is created to be used (after lithographic enhancements are applied if appropriate) for production of lithography masks. During mask data preparation 1232, the 'tape-out' data is used to produce lithography masks that are used to produce finished integrated circuits.

A storage subsystem of a computer system (such as computer system 1300 of FIG. 13) may be used to store the programs and data structures that are used by some or all of the EDA products described herein, and products used for development of cells for the library and for physical and logical design that use the library.

Figure 13:
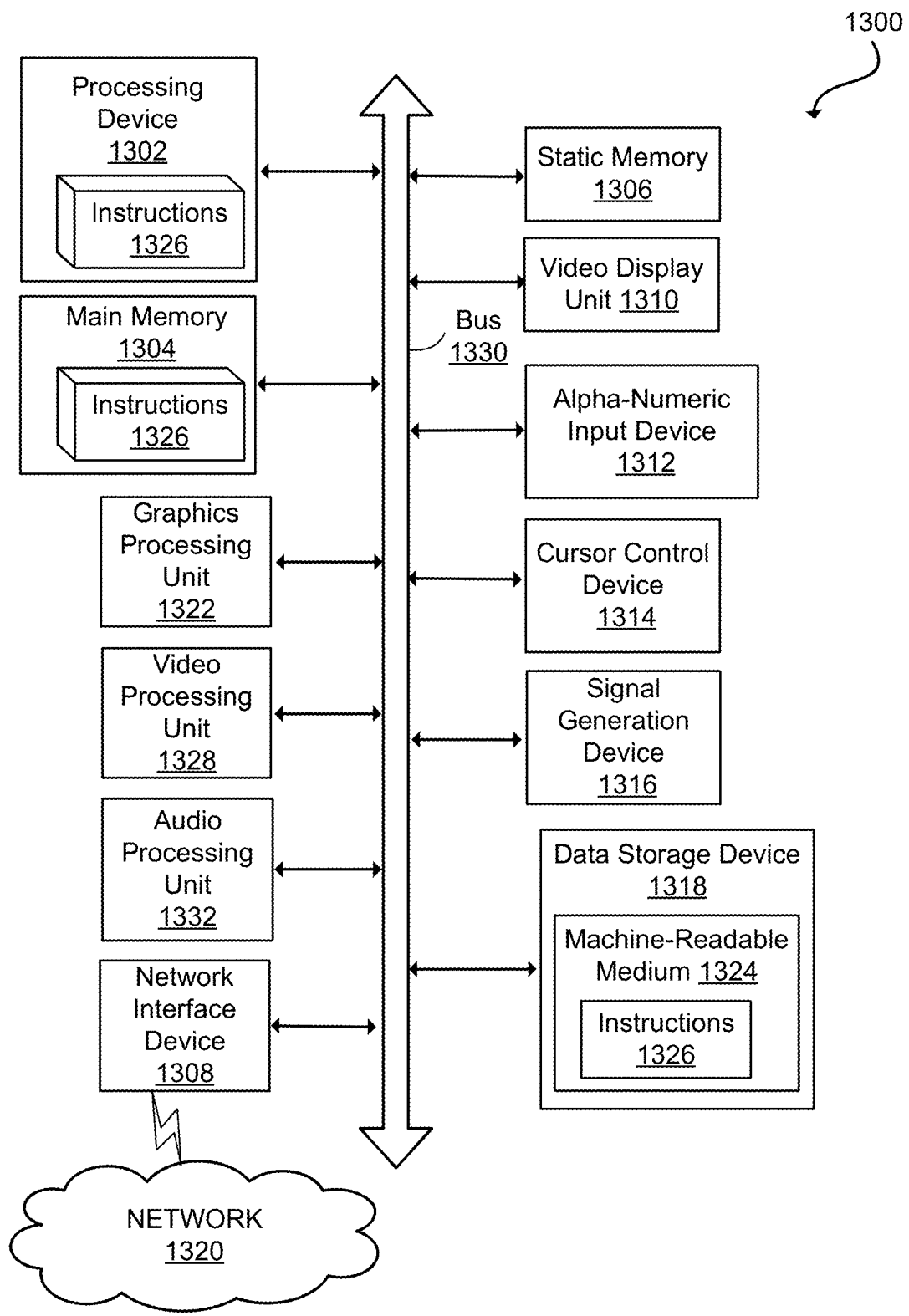
FIG. 13 depicts an abstract diagram of an example computer system in which embodiments of the present disclosure may operate.

FIG. 13 illustrates an example machine of a computer system 1300 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1300 includes a processing device 1302, a main memory 1304 (e.g., read-only memory (ROM), flash memory, dynamic random access memory (DRAM) such as synchronous DRAM (SDRAM), a static memory 1306 (e.g., flash memory, static random access memory (SRAM), etc.), and a data storage device 1318, which communicate with each other via a bus 1330.

Processing device 1302 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1302 may also be one or more special-purpose processing devices such as an application specific integrated circuit (ASIC), a field programmable gate array (FPGA), a digital signal processor (DSP), network processor, or the like. The processing device 1302 may be configured to execute instructions 1326 for performing the operations and steps described herein.

The computer system 1300 may further include a network interface device 1308 to communicate over the network 1320. The computer system 1300 also may include a video display unit 1310 (e.g., a liquid crystal display (LCD) or a cathode ray tube (CRT)), an alphanumeric input device 1312 (e.g., a keyboard), a cursor control device 1314 (e.g., a mouse), a graphics processing unit 1322, a signal generation device 1316 (e.g., a speaker), graphics processing unit 1322, video processing unit 1328, and audio processing unit 1332.

The data storage device 1318 may include a machine-readable storage medium 1324 (also known as a non-transitory computer-readable medium) on which is stored one or more sets of instructions 1326 or software embodying any one or more of the methodologies or functions described herein. The instructions 1326 may also reside, completely or at least partially, within the main memory 1304 and/or within the processing device 1302 during execution thereof by the computer system 1300, the main memory 1304 and the processing device 1302 also constituting machine-readable storage media.

In some implementations, the instructions 1326 include instructions to implement functionality corresponding to the present disclosure. While the machine-readable storage medium 1324 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1302 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

We claim as follows:

1. A method for forming an integrated circuit, the method comprising:
forming a first spacer on sidewalls of a first trench in a hardmask that is on a dielectric layer;
patterning the dielectric layer using the hardmask and the first spacer as a mask to form a first channel having a cross-sectional area that is smaller than a cross-sectional area of the first trench;
forming a second spacer on sidewalls of a second trench in the hardmask;
patterning the dielectric layer using the hardmask and the second spacer as a mask to form a second channel having a cross-sectional area that is smaller than a cross-sectional area of the second trench;
removing the hardmask, the first spacer, and the second spacer;
depositing a metal into the first channel and the second channel in the dielectric layer; and
performing a double patterning pitch splitting process including a plurality of mask-exposures used to form a plurality of conductors that electrically couple to at least the first channel and the second channel.

2. The method of claim 1, wherein
the dielectric layer is disposed on a substrate that includes the integrated circuit, which is formed by the double patterning pitch splitting process and the plurality of mask exposures comprises a first mask-exposure and a second mask-exposure,
the integrated circuit includes (i) a first set of conductors formed by the first mask-exposure and (ii) a second set of conductors formed by the second mask-exposure,
the plurality of conductors comprises the first set of conductors and the second set of conductors, and
the first channel in the dielectric layer electrically contacts the first set of conductors and the second channel in the dielectric layer electrically contacts the second set of conductors.

3. The method of claim 2, wherein the integrated circuit comprises at least a portion of a 6T SRAM.

4. The method of claim 2, wherein the first set of conductors and the second set of conductors are substantially parallel to each other, and wherein the first channel and the second channel are disposed at a substantially acute angle with respect to the first set of conductors and the second set of conductors.

5. The method of claim 1, wherein the first channel and the second channel in the dielectric layer are substantially parallel to each other and electrically insulated from each other.

6. The method of claim 5, wherein a closest distance between the first channel and the second channel is less than 10 nanometers.

7. The method of claim 1, wherein the first spacer comprises aluminum oxide and the hardmask comprises amorphous silicon.

8. A method for forming an integrated circuit, the method comprising:
depositing a dielectric layer on a substrate;
depositing a first hardmask on the dielectric layer;
depositing a second hardmask on the first hardmask;
patterning the second hardmask to form a first trench in the second hardmask;
depositing a first spacer material on the second hardmask and in the first trench;
partially etching the first spacer material so as to leave a first spacer on sidewalls of the first trench;
patterning the first hardmask using the second hardmask and the first spacer as a mask to form a first trench extension having a cross-section that is smaller than a cross-section of the first trench;
patterning the second hardmask to form a second trench in the second hardmask;
depositing a second spacer material on the second hardmask and in the second trench;
partially etching the second spacer material so as to leave a second spacer on sidewalls of the second trench;
patterning the first hardmask using the second hardmask and the second spacer as a mask to form a second trench extension having a cross-section that is smaller than a cross-section of the second trench;
removing the first spacer and the second spacer;
removing the second hardmask;
patterning the dielectric layer using the first hardmask, the first trench extension, and the second trench extension to form a first channel and a second channel in the dielectric layer;
depositing metal on the dielectric layer and in the first channel and the second channel; and
removing the metal on the dielectric layer and leaving the metal in the first channel and the second channel.

9. The method of claim 8, wherein
the substrate includes the integrated circuit, which is formed by a double patterning pitch splitting process that includes a first mask-exposure and a second mask-exposure,
the integrated circuit includes (i) a first set of conductors formed by the first mask-exposure and (ii) a second set of conductors formed by the second mask-exposure, and
the first channel electrically contacts the first set of conductors and the second channel electrically contacts the second set of conductors.

10. The method of claim 9, wherein the integrated circuit comprises at least a portion of a 6T SRAM.

11. The method of claim 9, wherein the first set of conductors and the second set of conductors are substantially parallel to each other, and wherein the first channel and the second channel are disposed at a substantially acute angle with respect to the first set of conductors and the second set of conductors.

12. The method of claim 8, wherein the first channel and the second channel in the dielectric layer are substantially parallel to each other and electrically insulated from each other.

13. The method of claim 12, wherein a closest distance between the first channel and the second channel is less than 10 nanometers.

14. The method of claim 8, wherein the first hardmask comprises nitride, the second hardmask comprises amorphous silicon or a carbon-based spin-on hardmask, and the first spacer material and the second spacer material comprise aluminum oxide.

15. A system comprising:
a memory storing instructions for performing a patterning technique to form an integrated circuit; and
a processor, coupled with the memory and to execute the instructions that, when executed, cause the processor to perform operations including:
forming a first spacer on sidewalls of a first trench in a hardmask that is on a dielectric layer;
patterning the dielectric layer using the hardmask and the first spacer as a mask to form a first channel having a cross-sectional area that is smaller than a cross-sectional area of the first trench;

forming a second spacer on sidewalls of a second trench in the hardmask;

patterning the dielectric layer using the hardmask and the second spacer as a mask to form a second channel having a cross-sectional area that is smaller than a cross-sectional area of the second trench;

removing the hardmask, the first spacer, and the second spacer;

depositing a metal into the first channel and the second channel in the dielectric layer; and performing a double patterning pitch splitting process including a plurality of mask-exposures used to form a plurality of conductors that electrically couple to at least the first channel and the second channel.

16. The system of claim 15, wherein the dielectric layer is disposed on a substrate that includes the integrated circuit, which is formed by the double patterning pitch splitting process and the plurality of mask exposures comprises a first mask-exposure and a second mask-exposure, the integrated circuit includes (i) a first set of conductors formed by the first mask-exposure and (ii) a second set of conductors formed by the second mask-exposure, the plurality of conductors comprises the first set of conductors and the second set of conductors, and the first channel in the dielectric layer electrically contacts the first set of conductors and the second channel in the dielectric layer electrically contacts the second set of conductors.

17. The system of claim 16, wherein the integrated circuit comprises at least a portion of a 6T SRAM.

18. The system of claim 16, wherein the first set of conductors and the second set of conductors are substantially parallel to each other, and wherein the first channel and the second channel are disposed at a substantially acute angle with respect to the first set of conductors and the second set of conductors.

19. The system of claim 15, wherein the first channel and the second channel in the dielectric layer are substantially parallel to each other and electrically insulated from each other.

20. The system of claim 19, wherein a closest distance between the first channel and the second channel is less than 10 nanometers.

* * * * *